(12) United States Patent
Mahara et al.

(10) Patent No.: US 6,309,116 B1
(45) Date of Patent: Oct. 30, 2001

(54) SUBSTRATE PROCESSING SYSTEM (75) Inventors: Koji Mahara, Kumamoto; Hiroyuki Kudou, Kikuchi-gun; Issei Ueda; Hiroichi Inada, both of Kumamoto, all of (JP)

(73) Assignee: Tokyo Electron Limited (JP)

(*) Notice: Subject to any disclaimer, the term of this patent is extended or adjusted under 35 U.S.C. 154(b) by 0 days.

(21) Appl. No.: 09/588,797

(22) Filed: Jun. 6, 2000

(30) Foreign Application Priority Data

Jun. 9, 1999 (JP) .................................. 11-162562
Dec. 9, 1999 (JP) .................................. 11-350144

(51) Int. Cl.[7] .............................. G03D 5/00; B65G 49/07
(52) U.S. Cl. ............................................. 396/611; 414/940
(58) Field of Search .................... 396/604, 611, 396/627, 612; 414/225, 416, 935–941; 118/52, 316, 319, 320, 500, 712, 54, 56; 134/1, 3, 4, 902; 427/240, 425

(56) References Cited

U.S. PATENT DOCUMENTS

| 5,570,994 | * | 11/1996 | Somekh et al. | 414/786 |
| 5,664,154 | | 9/1997 | Ohkura et al. | 396/612 |
| 6,056,998 | * | 5/2000 | Fujimoto | 427/240 |

* cited by examiner

Primary Examiner—D. Rutledge
(74) Attorney, Agent, or Firm—Fulbright & Jaworski, L.L.P.

(57) ABSTRACT

A substrate processing system for processing a substrate in accordance with a photolithographic process, comprising a cassette section, a process section having a plurality of process units each processing a substrate, main transfer arm mechanism arranged in a transfer space surrounded by the process section and the cassette section, for transporting substrates one by one not only between a cassette of the cassette section and each of the plurality of process units but also between the plurality of process units, and a loop transfer path movably supporting the main transfer arm means in a lower portion of the transfer space and guiding the main transfer arm means so as to face each of the process units and the cassette section.

16 Claims, 11 Drawing Sheets

SUBSTRATE PROCESSING SYSTEM

CROSS-REFERENCE TO RELATED APPLICATIONS

This application is based upon and claims the benefit of priority from the prior Japanese Patent Applications No. 11-162562, filed Jun. 9, 1999; and No. 11-350144, filed Dec. 9, 1999, the entire contents of which are incorporated herein by reference.

BACKGROUND OF THE INVENTION

The present invention relates to a substrate processing system for processing a substrate such as a semiconductor wafer in accordance with a photo-lithographic process.

In a manufacturing process of a semiconductor device, a semiconductor wafer is coated with a resist, and then the resist coating film is baked, exposed to light, and developed. Such a manufacturing process is carried out by using a substrate processing system (coating/developing system) disclosed in U.S. Pat. No. 5,664,254. In this system, resist coating, baking, and developing treatments excluding a light-exposure treatment are applied to a wafer. The process units are vertically stacked in multiple stages. A wafer is transferred to each of the process units by a main transfer arm mechanism which moves up and down along a transfer space arranged at the center of the system.

In the near future, the diameters of the wafers are planned to be changed from 8-inches to 12-inches (300 mm). When a large-size wafer is processed in accordance with a conventional system, the apparatus having quite a large footprint is required. In addition, the transfer arm must be moved horizontally for a long distance to transfer the large-size wafer, in other words, the moving stroke of the transfer arm becomes excessively long. As a result, the main transfer arm mechanism itself is enlarged more than required. Furthermore, the conventional system has a problem of a low maintainability since a maintenance operation must be applied from the outside the system.

BRIEF SUMMARY OF THE INVENTION

An object of the present invention is to provide a substrate processing system for processing a large substrate with a high throughput, characterized in that a transfer mechanism has a compact size with a small footprint, and excellent maintainability.

According to the present invention, there is provided a substrate processing system for processing a substrate in accordance with a photolithographic process, comprising:

a cassette section;

a process section having a plurality of process units each processing a substrate;

main transfer arm means arranged in a transfer space surrounded by the process section and the cassette section, for transporting substrates one by one not only between a cassette of the cassette section and each of the plurality of process units but also between the plurality of process units; and a loop transfer path movably supporting the main transfer arm means in a lower portion of the transfer space and guiding the main transfer arm means so as to face each of the process units or the cassette section.

According to the present invention, the distance from the main transfer arm mechanism to each of the process units is shortened by a radius of the loop transfer path. It is therefore possible to smoothly load a large substrate into the process unit. As a result, the throughput increases. In addition, since the foot print of the system is reduced, the main transfer arm means is prevented from being enlarged.

Furthermore, according to the present invention, it is possible to increase the transfer space itself. Therefore, the maintainability of the main transfer arm mechanism and the process unit can be improved.

In the case where the cassette section has a plurality of cassette tables vertically stacked in multiple stages and the process section has a plurality of process units vertically stacked in multiple stages, the main transfer arm means comprises a holder for holding the substrate;

a loop moving mechanism for moving the holder along the loop transfer path;

an up-and-down moving mechanism for moving the holder up and down; and a back-and-forth moving mechanism for moving the holder back and forth.

The loop transfer path has a pair of support guide rails; and a monorail having a rectangular sectional shape and interposed between the pair of support guide rails.

The loop moving mechanism comprises a cart having an upside-down U-letter sectional shape;

a plurality of wheels attached to the lower portion of the cart and driven to rotate on the support guide rails;

at least one pair of moving rollers attached to a depressed portion of the cart in contact with a side surface of the monorail;

a plurality of follower rollers driven to rotate on the monorail; and a motor for initiating rotation of the driving roll.

The main transfer arm means comprises a cylindrical support;

a plurality of holders for holding the substrate;

an up-and-down moving mechanism for moving the plurality of holders up and down in the cylindrical support;

a loop moving mechanism for moving the plurality of holders together with the cylindrical support along the loop transfer path; and a plurality of back-and-forth moving mechanisms for independently moving the holders back and forth.

Each of the plurality of process units has a substrate loading/unloading port formed facing up so as to face the transfer space.

The process section comprises a coating unit for applying a resist solution to the substrate;

a developing unit for developing a resist film applied on the substrate; and a thermal processing unit for applying a heat treatment to the substrate.

It is preferable that the system of the present invention should further comprise a clean-air supply mechanism for supplying a down-flow of clean air into a space formed between adjacent process units. As the clean air supply mechanism, it is desirable to use an air cleaning unit having a fan filter unit (FFU) and an alkaline substance removing mechanism.

The system of the present invention may further comprise an interface section for transferring the substrate to/from a light exposure apparatus and for transferring the substrate to/from a washing apparatus.

The interface section is desirably arranged near the transfer space and in a position accessible by the main transfer arm means.

Figure 1:
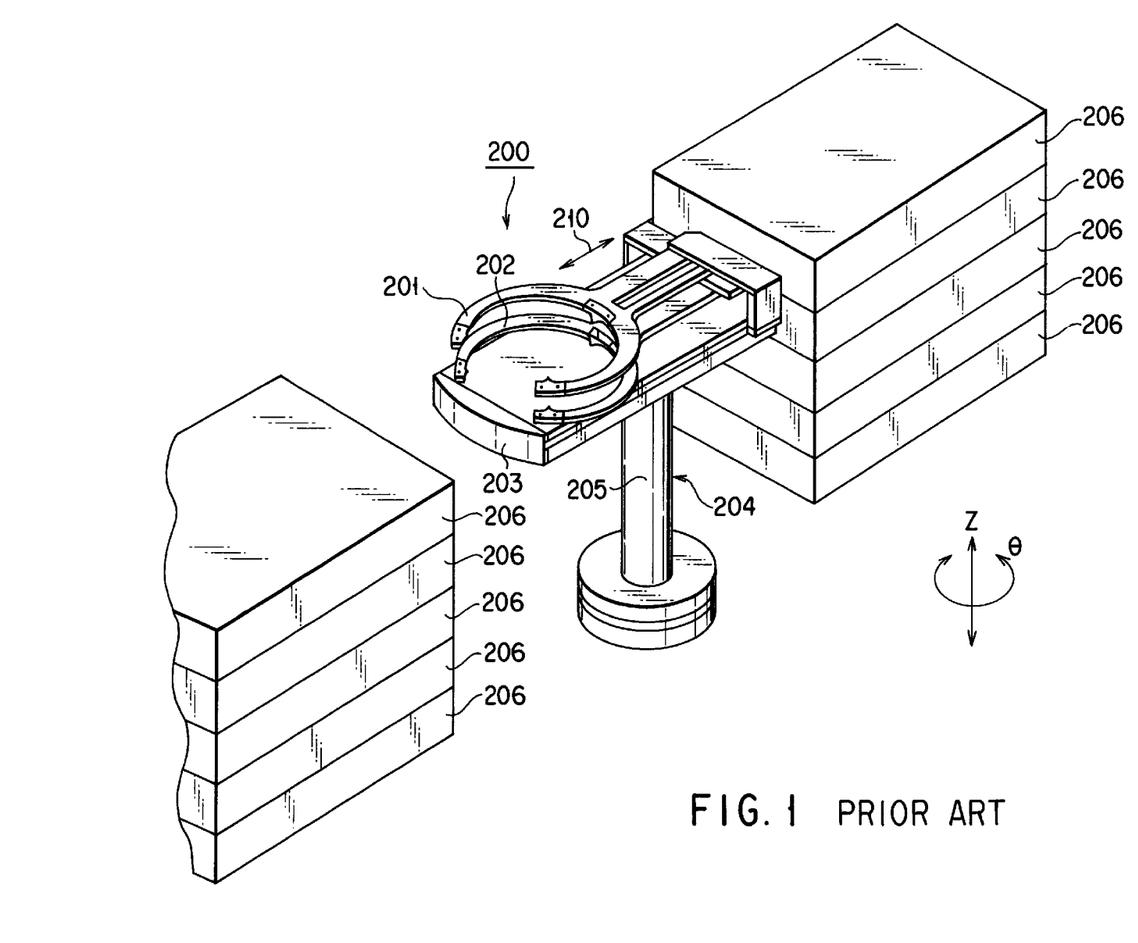
FIG. 1 is a schematic perspective view of a conventional apparatus.

FIG. 1 shows a schematic structure of a conventional substrate transfer system. A main transfer arm mechanism 200 has a transfer table 203 having two holders 201, 202 capable of holding the wafer W in upper and lower portions and a liftable rotating mechanism 204 for moving the transfer table 203 up and down and rotating it by an angle of θ. The holders 201, 202 can be moved back and forth by a moving mechanism (not shown) housed in the transfer table 203, in the direction indicated by a double-headed arrow 210.

However, since a single main transfer arm mechanism 200 transports the wafer W between various process units and loads/unloads the wafer W into/from various process units in the conventional system, the wafer W is not transferred between the process units 206 at the same time as the wafer W is loaded/unloaded into/from the various process units 206. As a result, it is impossible to reduce the time required for coating/developing the wafer W.

Furthermore, if the up-and-down movement, rotation of the transfer table 203, and back-and-forth movement of the holders 201, 202 are performed by the main transfer arm mechanism 200, the burden on the main transfer arm mechanism becomes significantly high, with the result that the transfer of the wafer W is delayed.

When the wafer is exposed to light in a light-exposure apparatus, the wafer is first mounted on the delivery table, and then, the wafer is transferred to a wafer holder used exclusively for transferring the wafer from the delivery table to the light-exposure apparatus. While the wafer remains on the delivery table, if another wafer is delivered there, the wafer holder cannot transfer the newly transferred wafer to the delivery table. Therefore, the transfer of the wafer is further delayed.

The present inventors conducted intensive studies to solve the aforementioned problems. As a result, they made the present invention.

According to the present invention, there is provided a substrate processing system for processing a substrate in accordance with a photolithographic process, comprising:

a cassette section;

a process section having a plurality of process units vertically stacked in multiple stages;

a plurality of circularly moving main transfer arm mechanisms arranged in a transfer space surrounded by the process section and the cassette section, and arranged at different heights corresponding to positions of the process units vertically stacked in multiple stages, for transferring substrates one by one not only between a cassette of the cassette section and each of the plurality of process units but also between the plurality of process units; and a loop transfer path movably supporting the circularly moving the main transfer arm mechanisms and guiding the circularly moving main transfer arm mechanisms so as to face each of the process units and the cassette section;

a plurality of delivery tables arranged in a middle region of the transfer space and arranged at different heights corresponding to positions of the process units stacked in the multiple stages; and a vertical transfer arm mechanism arranged at the middle region of the transfer space, for transferring the substrates one by one to/from each of the circularly moving transfer arm mechanisms via the delivery table.

Each of the circularly moving transfer arm mechanisms comprises a holder for holding the substrate;

a loop moving mechanism for moving the holder along the loop transfer path;

a θ rotary moving mechanism for rotating the holder about a vertical shaft; and a back-and-forth moving mechanism for moving the holder back and forth.

The vertical transfer arm mechanism can possess one or two or more holders. It is preferable that the vertical transfer arm mechanism should have a plurality of holders. This is because the throughput can increase.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Now, various preferred embodiments of the present invention will be explained with reference to the accompanying drawings. In the first place, a substrate processing system according to a first embodiment of the present invention will be explained with reference to FIGS. 2–7.

Figure 2:
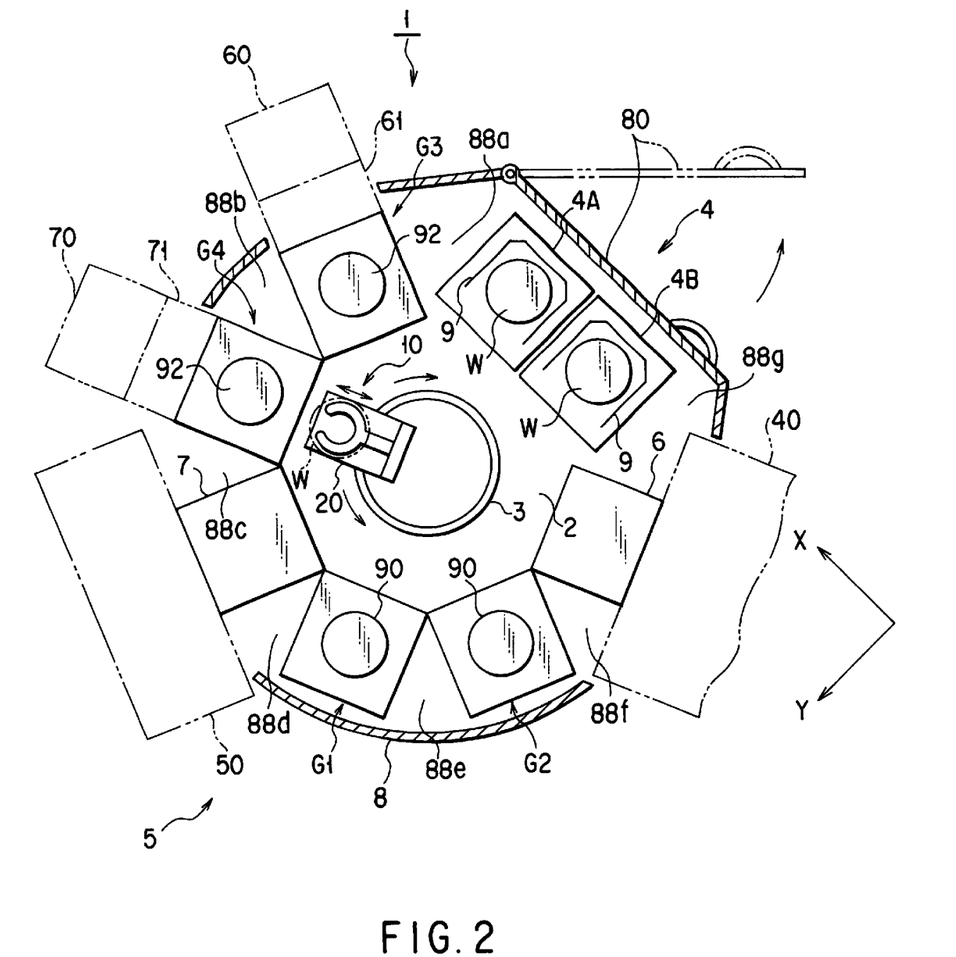
FIG. 2 is a perspective sectional view of an inner structure of a substrate processing apparatus according to an embodiment of the present invention, as viewed from above.

Reference numeral 1 denotes a substrate processing system which is surrounded by an exterior jacket 8 made of a metal plate. The substrate processing system has a cassette section 4, process section 5, and first and second interface sections 6, 7 and a main transfer arm mechanism 10. A side door 80 is formed in the exterior jacket 8. A cassette 9 is loaded/unloaded into/from the cassette section 4 by opening the side door 80. The cassette section has a receipt portion 4A and a deliver section 4B. A cassette 9 storing unprocessed wafers W is loaded into the receipt portion 4A. A cassette 9 storing processed wafers W is unloaded from the deliver portion 4B.

The process section 5 has four process unit groups G1, G2, G3, G4, which are arranged so as to surround a transfer space 2 of the center of the system 1. Process units of each of the process unit groups G1, G2, G3, G4 are vertically stacked in multiple stages.

The system 1 is connected to a light-exposure apparatus 40 via the first interface section 6. The wafer W is transferred between a transfer unit (not shown) and the main transfer arm mechanism 10. The system 1 is connected to a washing apparatus 50 via the second interface section 7. The wafer is transferred between a transfer unit (not shown) and the main transfer arm mechanism 10.

As shown in FIG. 2, the first process section G1 and the second process section G2 are arranged next to each other. The third process section G3 and the fourth process section G4 are arranged next to each other. The first interface section 6 is arranged between the cassette section 4 and the second process section G2. The second interface section 7 is arranged between the first process section G1 and the fourth process section G4. Clean air is downwardly supplied from a fine filter unit 99 (shown in FIG. 4) to the transfer space 2 and dead spaces 88a, 88b, 88c, 88d, 88e, 88f, 88g. An exhaust apparatus (not shown) is arranged at a floor portion of the system 1, for exhausting air which has passed through the system 1. Note that various connecting lines and pipes may be arranged in the dead spaces 88a, 88b, 88c, 88d, 88e, 88f, 88g.

Each of the process units of the process unit groups G1, G2, G3, G4 has a loading/unloading port for loading and unloading the wafer W. The loading/ unloading port faces the transfer space 2.

A loop transfer path 3 is arranged in the center of a lower portion of the transfer space 2. A main transfer arm mechanism 10 moves on the loop transfer path 3. The loop transfer path 3 is arranged so as to keep substantially the same distance from the main transfer arm mechanism 10 to each of the process units.

Figure 3:
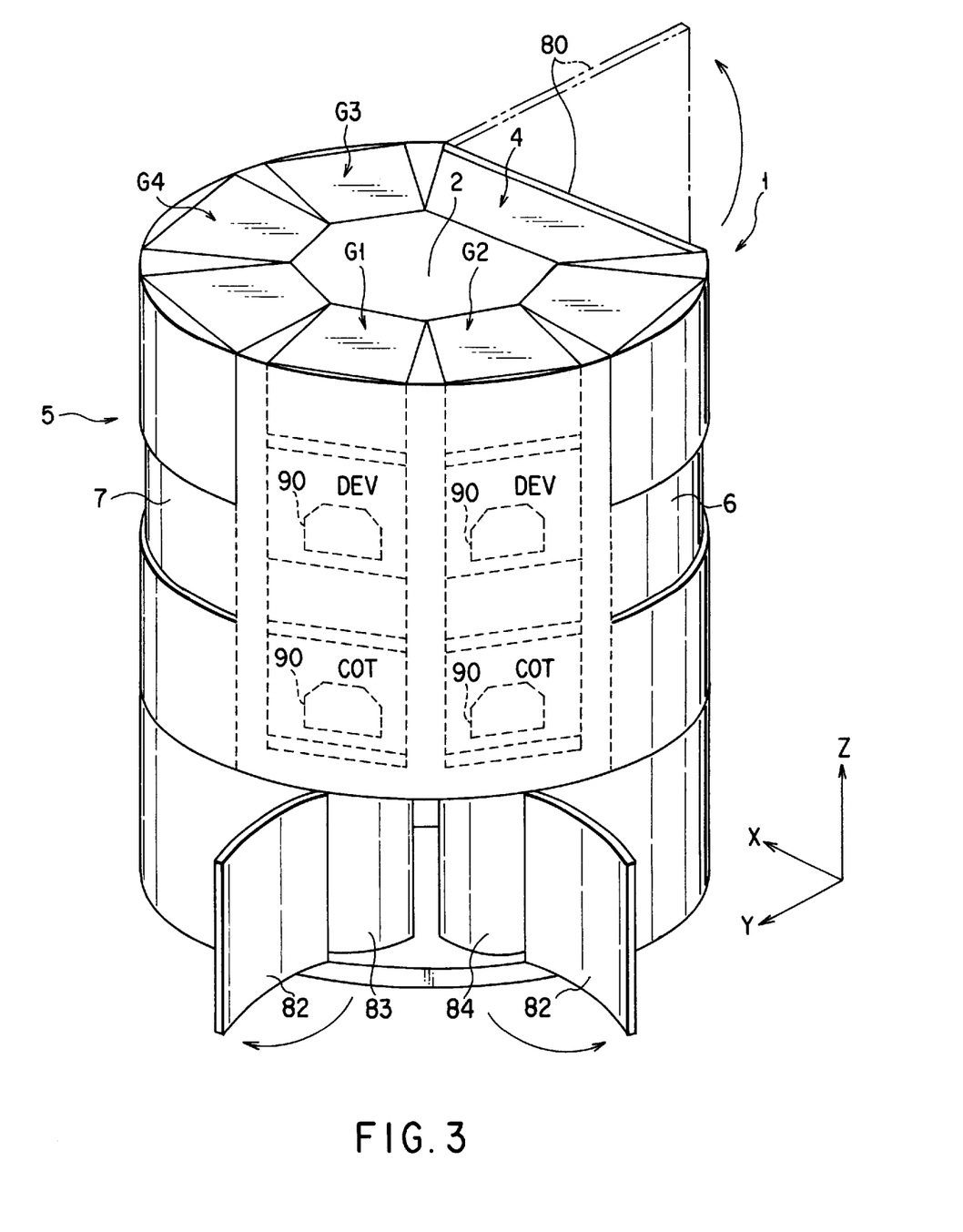
FIG. 3 is a schematic perspective view of a substrate processing apparatus according to the embodiment of the present invention.

As shown in FIG. 3, a door 82 is attached at the lower portion of the exterior jacket 8. An operator can enter the transfer space 2 by opening the door 82. A resist solution tank 83 and a developing liquid tank 84 are arranged at the lower portion of the transfer space 2.

The first process section G1 has two developing units (DEV) stacked one upon the other. The second process section G2 has a developing unit (DEV) and a resist coating unit (COT) stacked one upon the other. In each of the developing unit and the resist-coating unit (COT), a nozzle (not shown) and a cup 90 are arranged. A spin chuck (not shown) is arranged in the cup 90.

Figure 4:
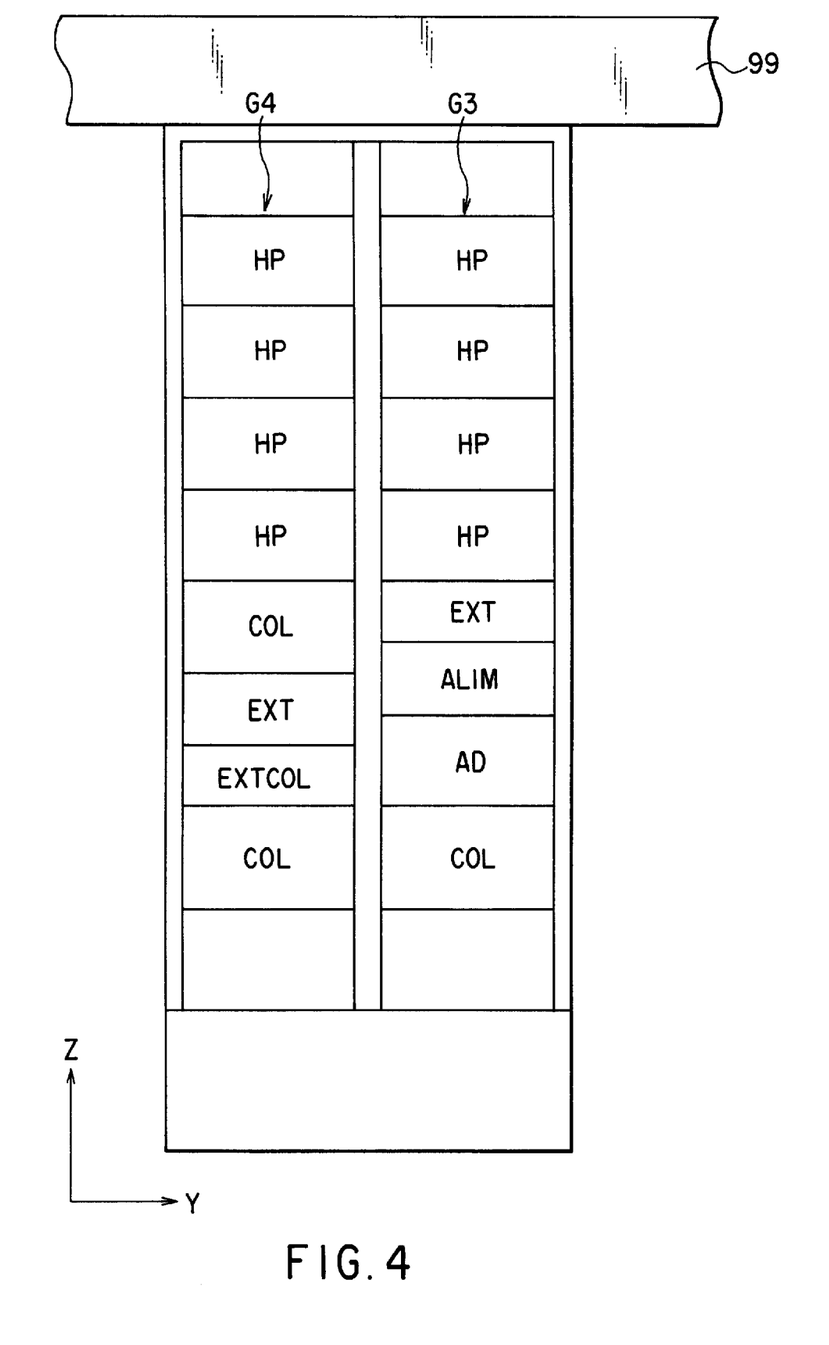
FIG. 4 is a schematic front view showing a thermal process unit group.

As shown in FIG. 4, eight thermal process system units are stacked in multiple stages in each of the third and fourth process sections G3, G4. Each unit has a mounting table 92 on which a wafer W is mounted. The cooling unit (COL) has a mechanism for cooling the wafer W. An adhesion unit has a mechanism for applying an adhesion treatment to the wafer W. An alignment unit (ALIM) has a mechanism for aligning the wafer W. An extension unit (EXT) has a mechanism for placing the wafer W in a stand-by status. An extension/cooling unit (EXTCOL) has a mechanism for cooling the wafer W while placing the wafer W in a stand-by status. A hot plate unit (HP) has a mechanism for heating the wafer W.

Note that a cooling unit (COL) having an alignment mechanism may be arranged in place of the alignment unit (ALIM).

Since the cooling unit (COL) and the extension/cooling unit (EXTCOL) whose processing temperatures are low, are arranged in lower stages, and the hot plate units (HP) whose processing temperatures are high, are arranged in higher stages, it is possible to minimize mutual thermal interference between the process units. Since the unit groups G1, G2 of a spinner type are arranged at a distance from the unit groups G3, G4 of the oven type, substantially no thermal influence is exerted upon the unit group G1, G2 of a spinner type by the units G3, G4 of an oven type.

Figure 5:
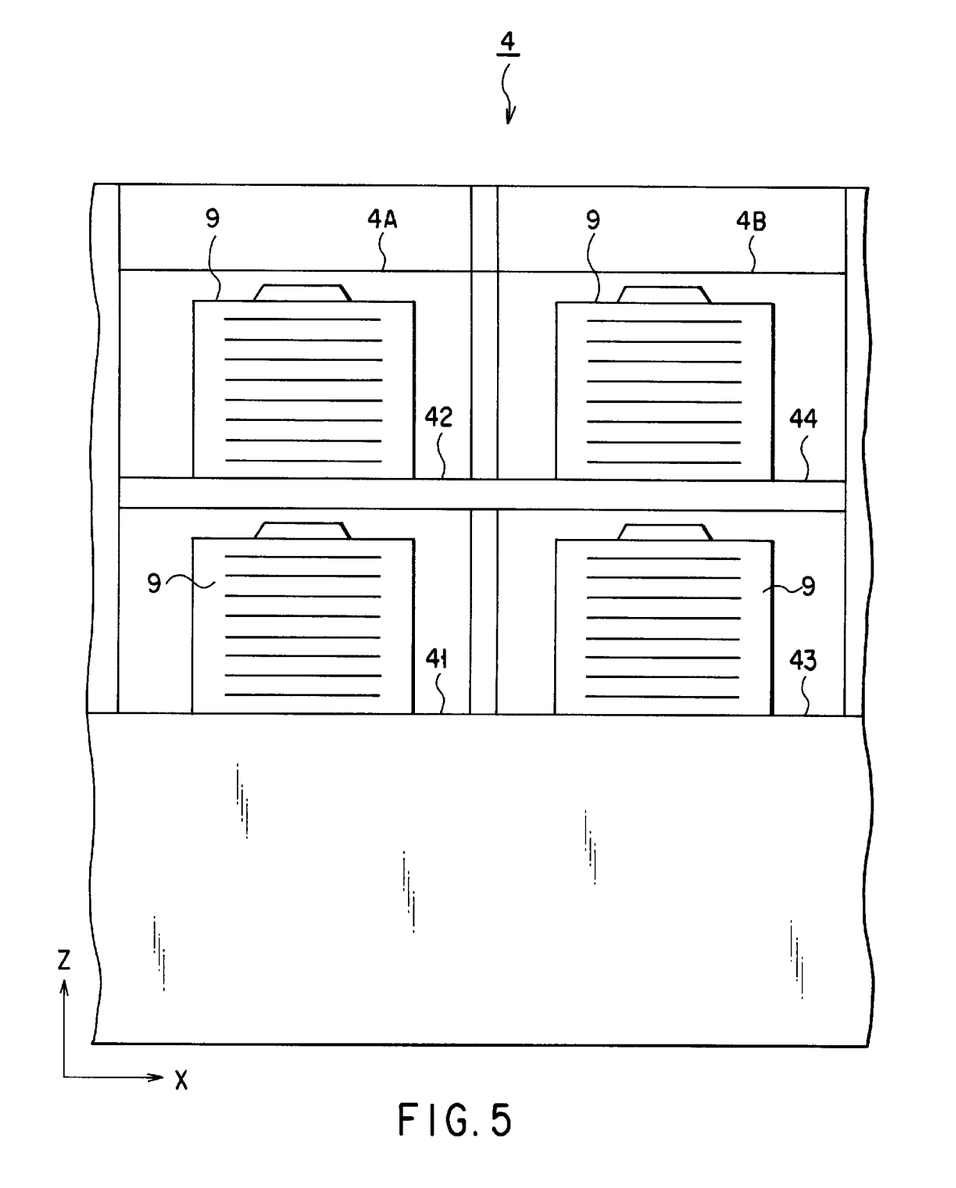
FIG. 5 is a schematic front view showing a cassette section.

As shown in FIG. 5, the cassette section 4 has the receipt portion 4A and the deliver portion 4B. Upper and lower stage mounting tables 41, 42 are arranged in the receipt portion 4A. The cassette 9 storing unprocessed wafers W is loaded into each of the mounting tables 41, 42. On the other hand, upper and lower stage mounting tables 43, 44 are arranged in the deliver portion 4B. The cassette 9 storing processed wafers W is loaded into each of the mounting tables 43, 44.

In the first interface section 6, a pick-up cassette and a buffer cassette (not shown) are arranged. Furthermore, a peripheral light-exposure apparatus (not shown) and a cooling plate (not shown) are arranged in the interface section 6. Note that the pick-up cassette (not shown) and the buffer cassette (not shown) are also arranged in the second interface section 7.

Furthermore, to the extension unit (EXT) of the third process section G3, a film-thickness measuring device 60 can be connected by way of a transfer unit 61. To the extension unit (EXT) of the fourth process section G4, a particle measuring device 70 can be connected by way of a transfer unit 71.

Figure 6:
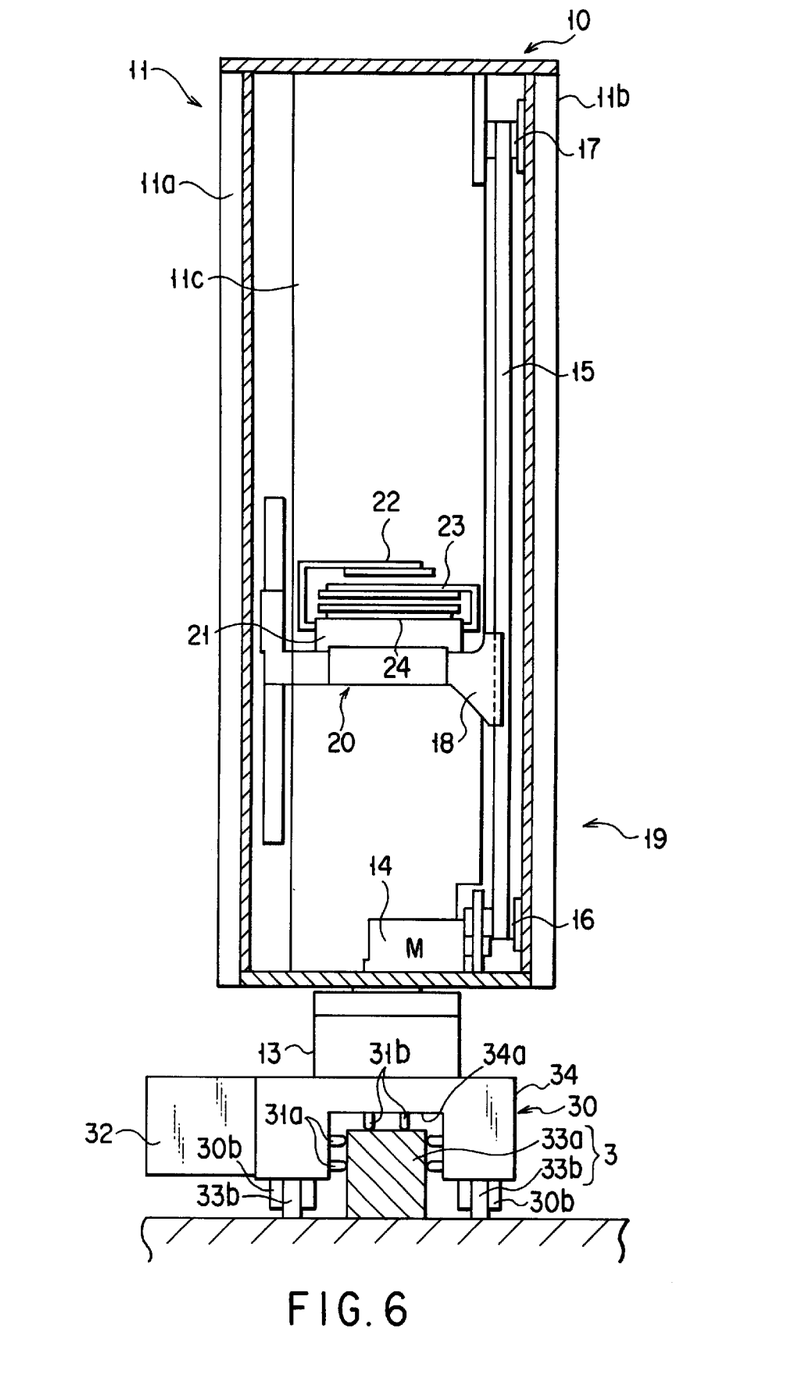
FIG. 6 is a cross-sectional view showing a main transfer arm mechanism.

As shown in FIG. 6, the main transfer arm mechanism 10 has a wafer transfer unit 20 for movably supporting three holders 22, 23, 24. The wafer transfer unit 20 is movably supported by an up-and-down moving mechanism 19 in a cylindrical support 11. The cylindrical support 11 is further movably supported by a loop moving mechanism 30 and a rotary moving mechanism 13. The holders 22, 23, 24 are movably supported on a base 21. The base 21 has a back-and-forth moving mechanism (not shown) for moving each of the holders 22, 23, 24 independently forward and backward. The back-and-forth moving mechanism of this type is disclosed in, for example, U.S. Pat. No. 5,664,254.

The cylindrical support 11 has vertical walls 11a, 11b. A side opening 11c is formed between the vertical walls 11a and 11b. The wafer transfer unit 20 moves the holders 22, 23, 24 back and forth through the side opening 11c.

The up-and-down moving mechanism 19 has a motor 14, a belt 15, a driving pulley 16, a follower pulley 17 and a connecting member 18. The driving pulley 16 is engaged in a driving shaft of the motor 14 via another member. The driving pulley 16 is fitted at the lower portion of the vertical wall 11b. The follower pulley 17 is fixed at the upper portion of the vertical wall 11b. The belt 15 is stretched between the driving pulley 16 and the follower pulley 17. The wafer transfer unit 20 is connected to the belt 15 by way of the connecting member 18.

The rotary moving mechanism (motor) 13 is fitted to the same shaft as the cylindrical support 11. The wafer transfer unit 20 is rotated about a Z-axis together with the cylindrical support 11.

The loop transfer path 3 has a monorail 33a, and a pair of support guide rails 33b. The monorail 33a having a rectangular sectional shape is placed between the pair of support guide rails. The right and left support guide rails are arranged at an equal distance from the monorail 33a. It is preferable that the radius of the loop transfer path 3 should fall within the range of 300–600 mm.

The loop moving mechanism 30 movably supports the entire main transfer arm mechanism 10. The loop moving mechanism 30 has a cart 34, a plurality of wheels 30b, a plurality of moving rollers 31a, a plurality of follower rollers 31b, and a motor 32. The cart 34 of an upside-down U-letter sectional shape has a depressed portion 34a. The moving roller 31a is fitted at one side of the wall surrounding the depressed portion 34a and rotated by the motor 32. The follower roller 31b is fixed at the other side of the wall and the upper wall. These moving roller 31a and the follower roller 31b are in contact with the monorail 33a. When the driving force is transmitted from the motor 32 to the driving roll 31a, the cart 34 moves along the monorail 33a.

The moving roller 31a and the follower roller 31b are made of a material rarely producing particles. Note that a plurality of wheels 33b are fixed at both sides of the lower portion of the cart 34. The wheel 33b is placed on the support guide rails 33b. The wheel 33b supports the weight of the cart 34 and the wafer transfer unit 20 and prevents the cart 34 from leaving the rails 33b.

Figure 7:
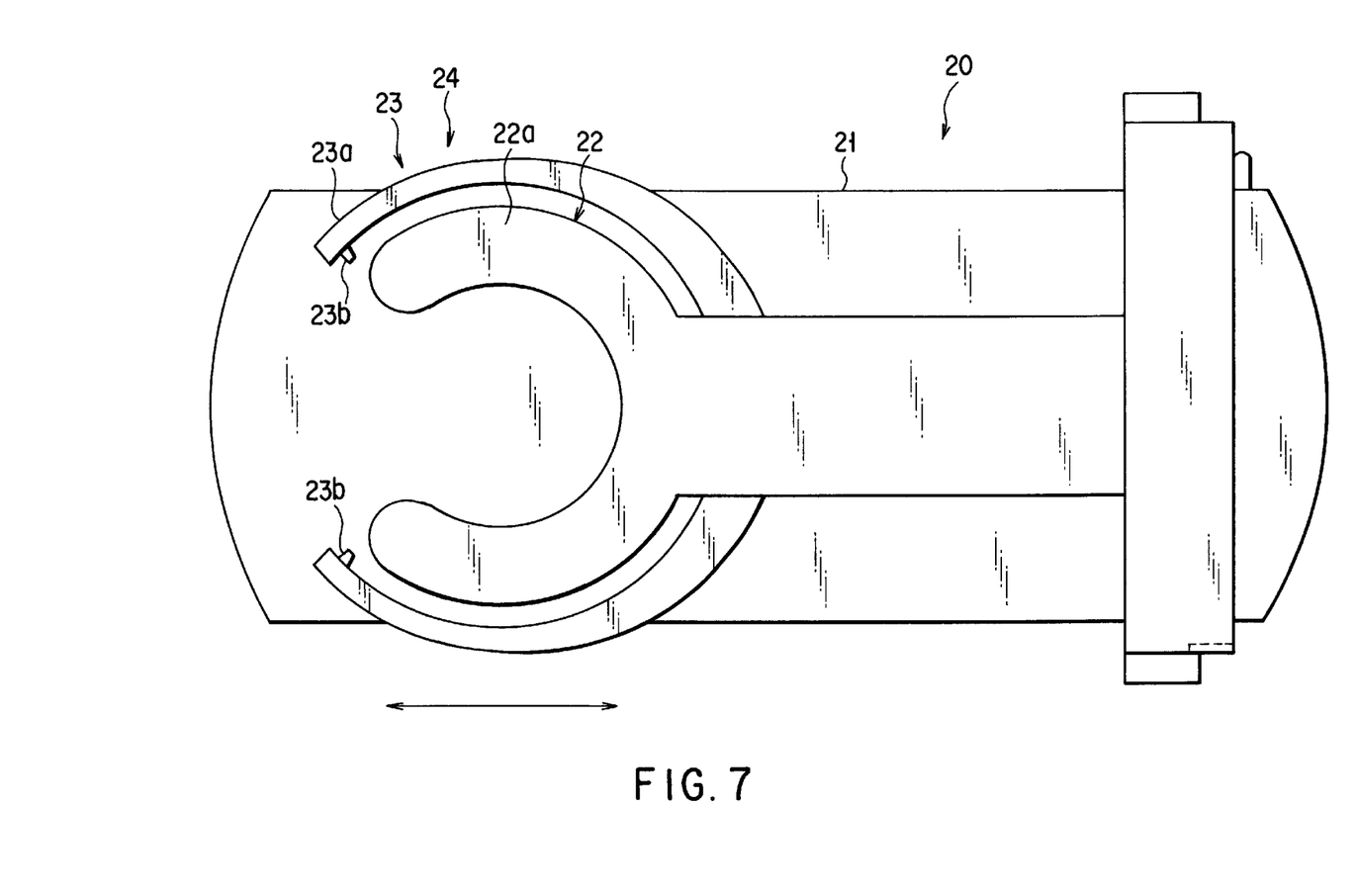
FIG. 7 is a schematic plan view showing a wafer holder of the main transfer arm mechanism.

As shown in FIG. 7, the wafer transfer unit 20 has a base 21 and three holders 22, 23, 24. The three holders 22, 23, 24 are arranged in the order mentioned from top. The first and second holders 22, 23 have C-letter tip portions 22a and 23a, respectively. The second holder 23 has three projections 23b for directly holding the wafer W. The third holder 24 (not shown) also has three projections 24b for directly holding the wafer W. These three holders 22, 23, 24 are independently moved back and forth in the direction indicated by an arrow shown in the FIG. 7, by a back-and-forth moving mechanism (not shown) housed in the base 21. The back-and-forth moving mechanism has a motor, pulley, and belt. The stroke of each of the holders by the back-and-forth moving mechanism is 330–370 mm in the case of an 8-inch wafer, and 550–650 mm in the case of a 12-inch wafer.

Now, how to operate the system 1 will be explained.

The main transfer arm mechanism 10 moves the wafer transfer unit 20 circularly together with the cylindrical support 11 along the loop transfer path 3. Consequently, the holder 22 is allowed to face the cassette section 4. The main transfer arm mechanism 10 moves the holder 22 forward and the holder 22 then picks up a single wafer W. Then, the main transfer arm mechanism 10 moves the wafer transfer unit 20 circularly along the loop transfer path 3. In this manner, the holder 22 is allowed to face the interface section 7. Then, the holder 22 is moved forward and transfers the wafer W to the interface section 7. Furthermore, the transfer unit (not shown) transfers the wafer W from the interface section 7 to the washing device 50. The wafer W is scrub-washed by the washing device 50 and returned to the main transfer arm mechanism 10 by way of the interface section 6.

The main transfer arm mechanism 10 transfers the water W to the adhesion process unit (AD) of the third process section G3. Adhesion treatment is applied to the wafer W in the adhesion unit (AD). The main transfer arm mechanism 10 takes out the wafer W from the adhesion process unit (AD) and transfers to any one of the cooling units of the third and fourth process sections G3, G4. The wafer W is cooled to room temperature in the unit (COL).

Then, the main transfer arm mechanism 10 transfers the wafer W to the resist coating unit (COT). In the resist coating unit (COT), a resist is applied onto the wafer W in accordance with a spin-coating method. Subsequently, the main transfer arm mechanism 10 transfers the wafer W to any one of hot plate units (HP) of the third and fourth process sections G3, G4. The wafer W is heated by a hot plate unit (HP), with the result that the resist coating film is baked. Thereafter, the main transfer arm mechanism 10 transfers the wafer W to any one of the cooling plate unit (COL) of the third and fourth process sections G3, G4. The wafer W is cooled to room temperature in the cooling plate unit (COL). At this time, if necessary, the wafer W may be transferred to the film-thickness measuring device 60 by way of the extension unit (EXT) of the third process section G3 in order to measure the thickness of the resist film. Alternatively, if necessary, the wafer W is transferred to the particle measuring device 70 by way of the extension unit (EXT) of the fourth process section G4 in order to count the number of particles on the resist film.

The main transfer arm mechanism 10 transfers the wafer W to the alignment unit (ALIM) of the third process section G3. The wafer W is aligned with the system 1 by the alignment unit (ALIM). Then, the main transfer arm mechanism 10 transfers the wafer W to the interface section 6.

In the interface section 6, the wafer W is transfers to the peripheral light exposure apparatus (not shown) by a transfer unit (not shown). In the peripheral light exposure apparatus, the resist coating film of the peripheral portion of the wafer is exposed to light. Then, the wafer W is cooled by a cooling plate (not shown) and transferred to the transfer unit (not shown). The transfer unit (not shown) loads the wafer W into the light exposure apparatus 40, in which the resist coating film is exposed to light with a pattern as a mask.

The wafer W is returned to the interface section 6 by the transfer unit (not shown) from the light exposure apparatus 40. The main transfer arm mechanism 10 transfers the wafer W from the interface section 6 to the hot plate unit (HP), in which the resist coating film is baked (this step is called post-exposure bake (PEB)). Subsequently, the main transfer arm mechanism 10 transfers the wafer W to the cooling unit (COL), in which the wafer W is cooled to room temperature.

The main transfer arm mechanism 10 transfers the wafer W to any one of the developing units (DEV) of the first and second process sections G1 and G2. In the developing unit (DEV), a pattern latent image on the resist coating film is developed. Subsequently, the main transfer arm mechanism 10 transfers the wafer W to the hot plate unit (HP), in which the wafer W is heated. In this way, the resist coating film is baked (Post baking). Thereafter, the main transfer arm mechanism 10 transfers the wafer W to a cooling unit (COL), in which the wafer W is cooled. The wafer W is loaded into a cassette 9 of the cassette section 4 by the main transfer arm mechanism 10. The wafer W is finally unloaded from the system 1 together with the cassette 9.

According to this embodiment, since the main transfer arm mechanism is moved along the loop transfer path, the back-and-forth moving stroke (horizontal moving distance) of the holder is suppressed so as not to become too long. As a result, the holder is supported by a small and light member. In particular, the small and light feature of the support member is helpful in transferring a large-size wafer by the main transfer arm mechanism.

Furthermore, a plurality of process units can be arranged without mutual interference, so that the footprint of the apparatus can be reduced.

Moreover, the transfer space is increased compared to the conventional one. Therefore, the maintenance operation of the main transfer arm mechanism and the process units can be easily performed.

Furthermore, if an interface unit is provided in the process section, a large apparatus (light-exposure apparatus, washing apparatus) can be externally connected to the system. The system is therefore expandable.

Note that the monorail moving system is applied to the loop transfer mechanism in the aforementioned embodiment. However, a linear-motor moving system may be employed in place of the monorail moving system.

The system of the present invention can be applied to a case where an LCD substrate is employed in place of a semiconductor wafer, as the substrate.

Now, referring to FIGS. 8–12, a second embodiment of the present invention will be explained.

Figure 8:
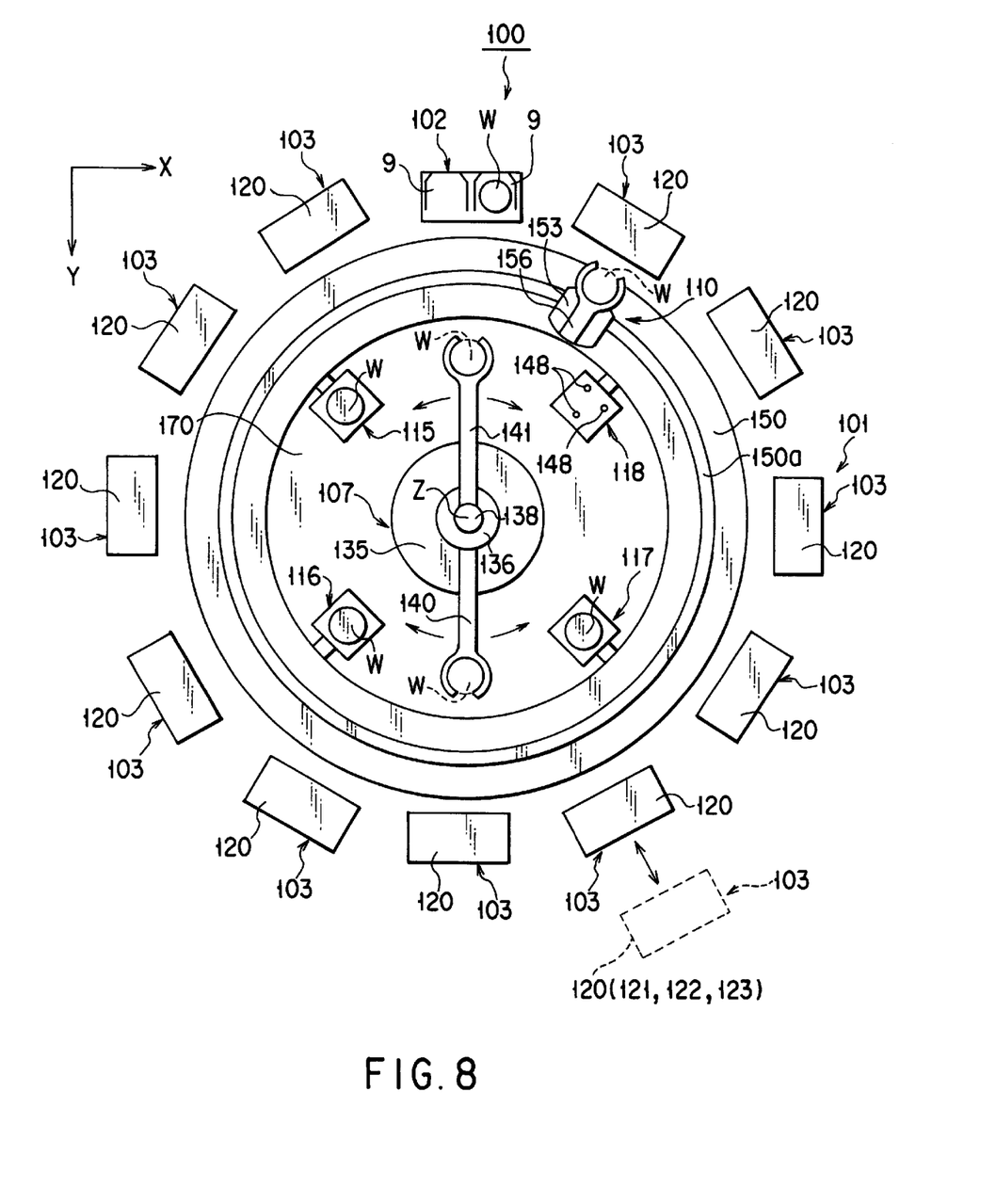
FIG. 8 is a perspective sectional view of a substrate processing apparatus according to another embodiment of the present invention, as viewed from above.

The substrate process system 100 has a process section 101, a cassette section 102, a vertical transfer arm mechanism 107, four circularly-moving transferring arm mechanisms 110, 111, 112, 113, and four delivery tables 115, 116, 117, 118. The system 100 is surrounded by an exterior jacket (not shown) having an open/shut door (not shown). The open/shut door is positioned immediately outside the cassette section 102. An operator or an automatic transfer robot opens the door and loads and unloads the cassette 9 into/from the cassette section 102. The cassette section 102 has a receipt portion and a deliver portion. The cassette 9 storing unprocessed wafers W is loaded into the receipt section. The cassette 9 storing processed wafers W is unloaded from the deliver section.

A transfer space 170 is formed at the center of the system 100. A vertical transfer arm mechanism 107 is arranged in the transfer space 170. The wafer W is vertically transferred in a z-axis direction.

Figure 9:
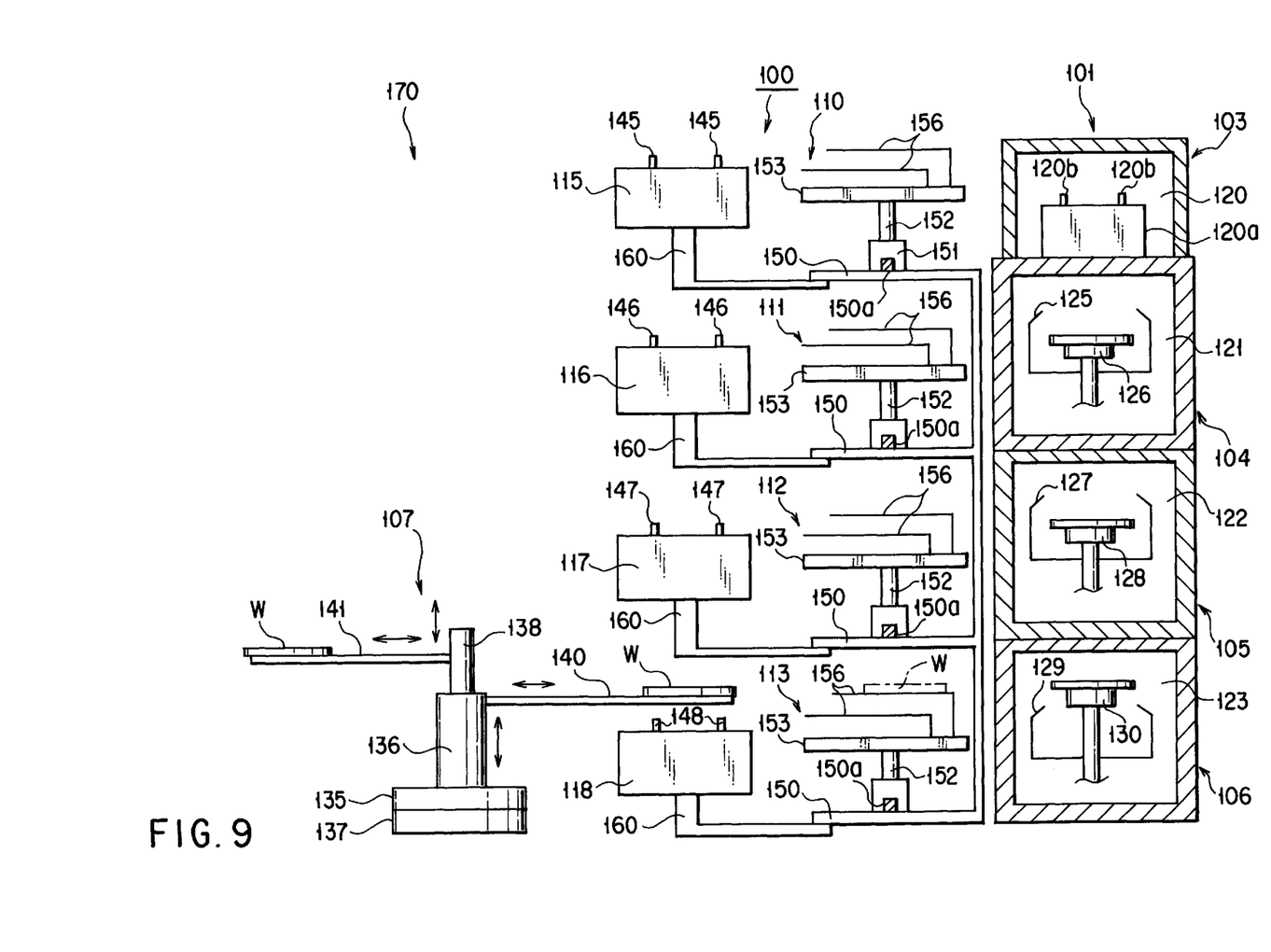
FIG. 9 is a perspective side sectional view of an inner structure of a substrate processing apparatus according to another embodiment of the present invention, as viewed from side.

Tables 150 vertically arranged in four stages are arranged so as to surround the transfer space 170. Loop transfer paths 150a are arranged respectively on the tables 150. The circularly moving arm mechanisms 110, 111, 112, 113 move respectively on the loop transfer paths 150a.

The delivery tables 115, 116, 117, 118 are respectively supported by the tables 150 by way of a bracket 160 so as to extend in the peripheral region of the transfer space 170. The delivery tables 115, 116, 117, 118 are located respectively between circularly-moving transfer arm mechanisms 110, 111, 112, 113 and the vertical transfer arm mechanism 107. The wafer W is transferred between the mechanisms 110, 111, 112, 113 and 107.

As shown in FIG. 8, the four delivery tables 115, 116, 117, 118 are arranged at equal intervals so as not to overlap with each other in the same plane. This is made to prevent mutual interference between two arm holders 140, 141 of the vertical transfer arm mechanism 107 and to improve a transfer efficiency of the wafer W.

The process section 101 and the cassette section 102 are arranged further outside the table 150. The process section 101 has 11 process unit groups 103. These 11 process unit groups 103 and the cassette section 102 are arranged around the table 150 so as to surround it.

As shown in FIG. 9, in each of the process unit groups 103, a thermal process unit 120, first liquid-process unit 121, second liquid-process unit 122, and third liquid-process unit 123 are stacked in the order mentioned from top. The thermal process unit 120 is placed at the same height as the first circularly-moving transfer arm mechanism 110 mounted on the uppermost table 150. The first liquid process unit 121 is placed at the same height as the second circularly-moving transfer arm mechanism 111. The second liquid process unit 122 is placed at the same height as the third circularly-moving transfer arm mechanism 112. The third liquid process unit 123 is arranged at the same height as the fourth circularly-moving transfer arm mechanism 113 arranged at the lowermost stage. Note that, in the same manner as in the process unit groups, cassette tables are stacked in four stages in the cassette section 102. One of the process unit groups 103 has an interface section. The wafer W is transferred to a light exposure apparatus (not shown) by way of the interface section.

The thermal process unit 120 has at least one of an adhesion mechanism, prebaking mechanism, post exposure baking mechanism, post baking mechanism, alignment mechanism, cooling mechanism and extension (stand-by) mechanism. Each unit 120 has a wafer table 120a having a plurality of lift pins 120b.

First to third liquid-processing units 121, 122, 123 have at least one of a resist coating mechanism, developing mechanism, and anti-reflection film coating mechanism. Each of units 121, 122, and 123 has a cup 125 and a spin chuck 126.

Figure 10:
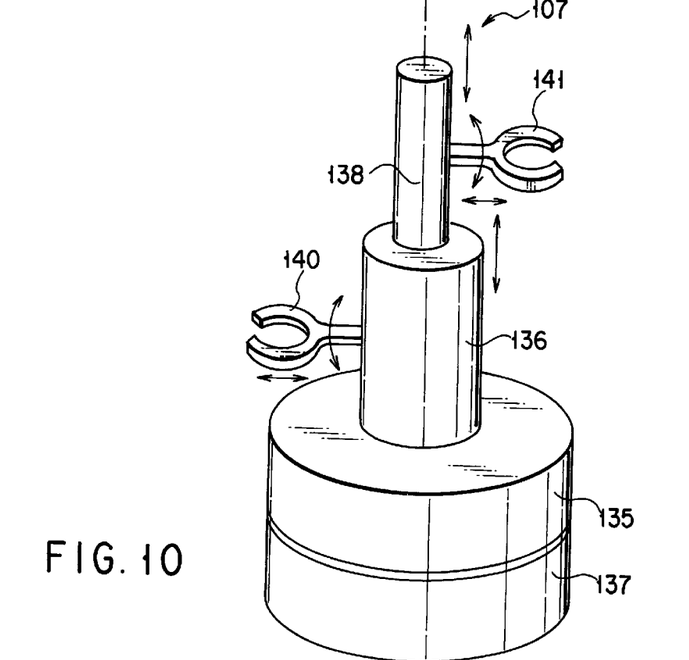
FIG. 10 is a perspective view showing an vertical transfer arm mechanism according to another embodiment.

Now, the vertical transfer arm mechanism 107 will be explained with reference to FIG. 10.

The vertical transfer arm mechanism 107 has two liftable rotary mechanisms 135, 137, two support members 136, 138, and two arm holders 140, 141. The arm holders 140, 141 are supported by the support members 136, 138, respectively. The support members 136, 138 are moved up and down respectively by the liftable rotary mechanisms 135, 137 in the z-axis direction and simultaneously rotated about the z-axis. Furthermore, a back and forth moving mechanism (not shown) is provided in each of the support members 136, 138. Each of arm holders 140, 141 is moved back and forth in the horizontal direction by the back and forth moving mechanism. Note that the second support member 138 is moved by the second liftable rotary mechanism 137 in a sufficiently long stroke (vertical moving distance) such that the second arm holder 141 delivers the wafer W to the uppermost delivery table 115.

Figure 11:
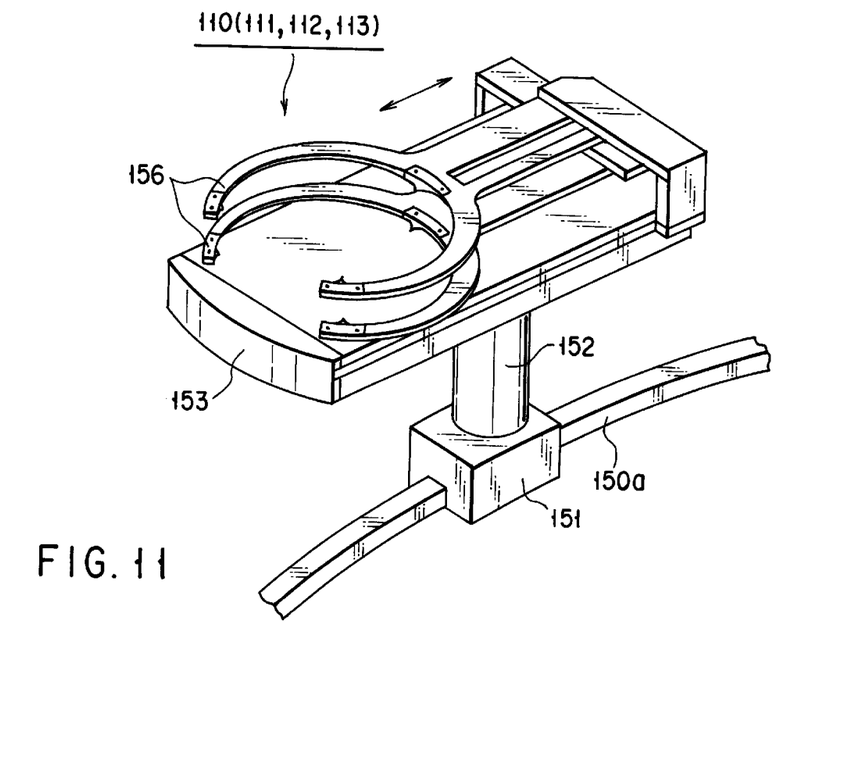
FIG. 11 is a perspective view showing a circularly-moving transfer arm mechanism according to another embodiment.

Now, referring to FIG. 11, the circularly-moving transfer arm mechanism 110 (111, 112, 113) will be explained.

The circularly-moving transfer arm mechanism 110 has a cart 151, a support shaft 152, a slide base 153, and upper and lower holders 156. The cart 151 houses a loop moving mechanism and a circularly moving mechanism (not shown). The loop moving mechanism employs a monorail moving system having substantially the same structure as in the first embodiment. When the moving roller (not shown) of the loop moving mechanism is in contact with the rail 150a, the driving force of a motor is transmitted to the moving roller. The circularly-moving mechanism has a rotary moving mean (not shown) for rotating a support shaft 152 about the z-axis. With this mechanism, the holders 156 are moved around the z-axis together with the support shaft 152.

The slide base 153 houses a back-and-forth moving mechanism (not shown). The back-and-forth moving mechanism has a motor, pulley and belt. The holders 156 are independently moved back and forth by these structural elements.

Now, how to operate the aforementioned system 100 will be explained.

The circularly-moving transfer arm mechanism 113 moves along a loop transfer path 150a to position the holder 156 so as to face the cassette section 4. The circularly-moving transfer arm mechanism 113 loads the holder 156 into the cassette section 4 to allow the holder 156 to take out a single wafer W from the cassette 9. Then, the circularly-moving transfer arm mechanism 113 moves along the loop transfer path 150a. As a result, the holder 156 is placed to face the delivery table 118. Then, the holder 156 is moved forward to transfer the wafer W to the delivery table 118.

The vertical transfer arm mechanism 107 allows the first arm holder 140 to face the delivery table 118 and to take out the wafer W (first wafer) from the delivery table 118. Subsequently, the arm holder 140 is moved upward and allowed to face the delivery table 115. The vertical transfer arm mechanism 107 allows the second arm holder 141 to take out another wafer W (second wafer) from the delivery table 115. Subsequently, the wafer W (first wafer) is transferred to the delivery table 115 by the first arm holder 140.

The circularly-moving transfer arm mechanism 110 takes out the wafer W from the delivery table 115 by the holder 156. Subsequently, the circularly-moving transfer arm mechanism 110 moves along the loop transfer path 150a to place the holder 156 to face the adhesion process unit 120. Thereafter, the wafer W is loaded into the unit 120 to apply adhesion treatment to the wafer W. Then, the wafer W is taken out from the unit 120 by the circularly-moving transfer arm mechanism 110 and transferred to the delivery table 115.

The vertical transfer arm mechanism 107 allows the second arm holder 141 to face the delivery table 115 and to take out the wafer W from the delivery table 115. The vertical transfer arm mechanism 107 moves down the second arm holder 141, rotates, places it to face the delivery table 116, and allowed it to transfer the wafer W to the delivery table 116.

The circularly-moving transfer arm mechanism 111 takes out the wafer W from the delivery table 116 by use of the holder 156. Then, the circularly-moving transfer arm mechanism 111 moves along the loop transfer path 150a and allowed the holder 156 to face the resist coating unit 121. Subsequently, the wafer is loaded into the unit 121 to coat the wafer W with a resist.

Thereafter, the wafer W is transferred subsequently to the prebaking unit, cooling unit, interface section, the light-exposure apparatus, interface section, post exposure baking unit, cooling unit, developing unit, post baking unit, and cooling unit in the order mentioned. In these units, individual treatments are applied to the wafer. The wafer W is finally loaded into the cassette 9 of the cassette section 4 by any one of the circularly-moving transfer arm mechanisms 110, 111, 112, 113 and stored therein.

Figure 12:
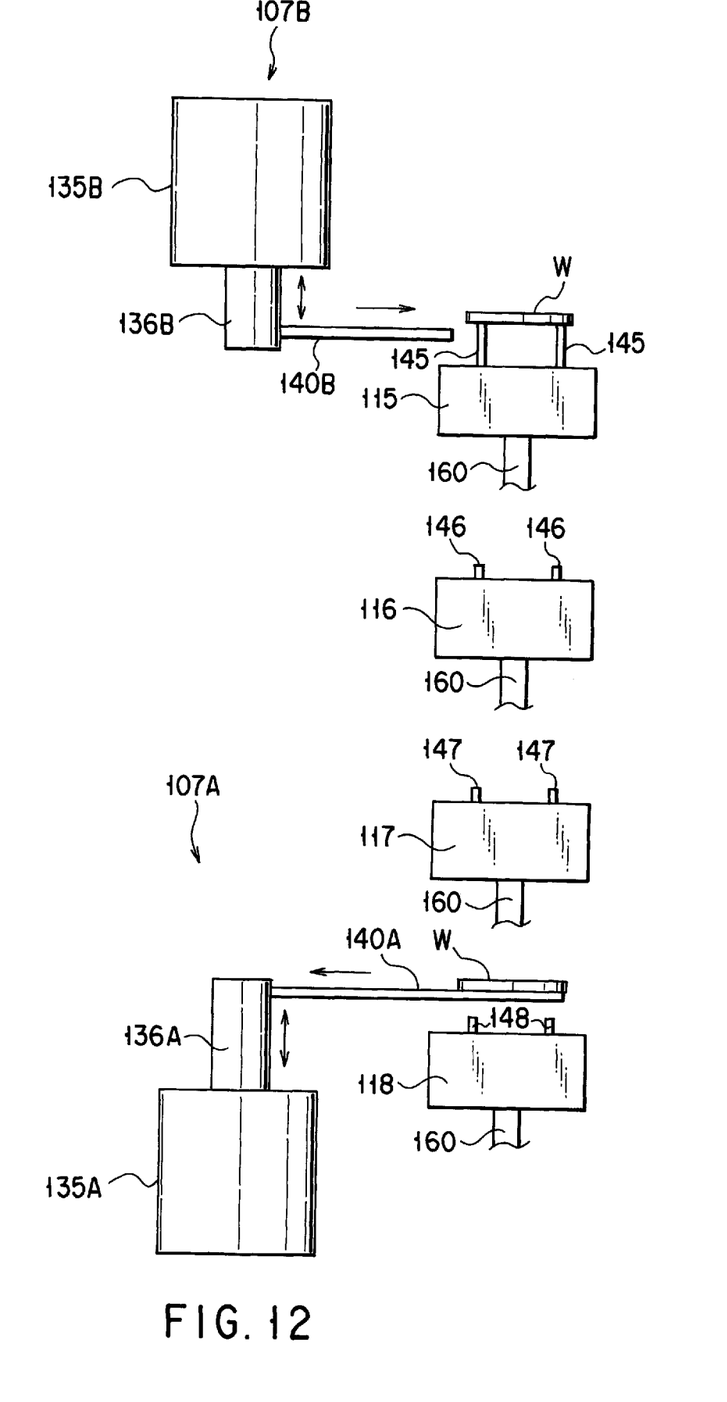
FIG. 12 is a vertical transfer arm mechanism according to another embodiment.

As shown in FIG. 12, the lower vertical transfer arm mechanism 107A may be used in combination with the upper vertical transfer arm mechanism 107B, in place of the vertical transfer arm mechanism 107. The upper vertical transfer arm mechanism 107B is supported by a ceiling portion (not shown) of the system 100. The upper vertical transfer arm mechanism 107B has a liftable rotation mechanism 135B, a support member 136B, a back-and forth moving mechanism (not shown), and a holder 140B. The lower vertical transfer arm mechanism 107A is supported by a floor portion (not shown) of the system 100. The lower vertical transfer arm mechanism 107A has a liftable rotation mechanism 135A, a support member 136A, a back-and forth moving mechanism (not shown), and a holder 140A.

The lower vertical transfer arm mechanism 107A transfers the wafer W to two delivery tables 117, 118 in the lower portion, whereas the upper vertical transfer arm mechanism 107B transfers the wafer W to two delivery tables 115, 116 in the upper portion. Since the lower vertical transfer arm mechanism 107A and the upper vertical transfer arm mechanism 107B shares the entire wafer transfer load, the burden applied on each mechanism is reduced. As a result, a failure of the system rarely occurs.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate processing system for processing a large substrate an accordance with a photolithographic process, comprising:
   a cassette section;
   a process section having a plurality of process units vertically stacked in multiple stages;
   main transfer arm means arranged in a transfer space surrounded by the process section and the cassette section, for transporting substrates one by one not only between a cassette of the cassette section and each of the plurality of process units but also between the plurality of process units; and
   a loop transfer path movably supporting the main transfer arm means in a lower portion of the transfer space and guiding the main transfer arm means so as to face each of the process units or the cassette section,
   wherein said main transfer arm means has a plurality of holders for holding the substrate, a loop driving mechanism for moving the holders along the loop transfer path, an up-and-down driving mechanism for moving the holders up and down, and a back-and-forth driving mechanism for moving the holders back and forth.

2. The system according to claim 1, wherein the cassette section has a plurality of cassette tables vertically stacked in multiple stages.

3. The system according to claim 1, wherein
   the loop transfer path has a pair of support guide rails; and
   a monorail having a rectangular sectional shape and interposed between the pair of support guide rails, and
   the loop moving mechanism comprises
      a cart having an upside-down U-letter sectional shape;
      a plurality of wheels attached to the lower portion of the cart and driven to rotate on the support guide rails;
      at least one pair of moving rollers attached to a depressed portion of the cart in contact with a side surface of the monorail;
      a plurality of follower rollers driven to rotate on the monorail; and
      a motor for initiating rotation of the driving roll.

4. The system according to claim 1, wherein the main transfer arm means comprises a cylindrical support;

a plurality of holders for holding the substrate;

an up-and-down moving mechanism for moving the plurality of holders up and down in the cylindrical support;

a loop moving mechanism for moving the plurality of holders together with the cylindrical support along the loop transfer path; and a plurality of back-and-forth moving mechanisms for independently moving the holders back and forth.

5. The system according to claim 1, wherein each of the plurality of process units has a substrate loading/unloading port formed facing up so as to face the transfer space.

6. The system according to claim 1, wherein the process section comprises a coating unit for applying a resist solution to the substrate;

a developing unit for developing a resist film applied on the substrate; and a thermal processing unit for applying a heat treatment to the substrate.

7. The system according to claim 1, further comprising a clean-air supply mechanism for supplying a down-flow of clean air into a space formed between adjacent process units.

8. The system according to claim 1, further comprising an interface section for transferring the substrate to/from a light exposure apparatus.

9. The system according to claim 1, further comprising an interface for transferring the substrate to/from a washing apparatus.

10. The system according to claim 8 or 9, wherein the interface section is arranged near the transfer space and in a position accessible by the main transfer arm means.

11. A substrate process system for processing a large substrate in accordance with a photolithographic process, comprising;

a cassette section;

a process section having a plurality of process units vertically stacked in multiple stages;

a plurality of circularly moving main transfer arm mechanisms arranged in a transfer space surrounded by the process section and the cassette section, and arranged at different heights corresponding to positions of the process units stacked in multiple stages, for transferring substrates one by one not only between a cassette of the cassette section and each of the plurality of process units but also between the plurality of process units, a loop transfer path movably supporting the circularly moving main transfer arm mechanisms and guiding the circularly moving main transfer arm mechanisms so as to face each of the process units and the cassette section;

a plurality of delivery tables arranged in a middle region of the transfer space and arranged at different heights corresponding to positions of the process units stacked in the multiple stages; and a vertical transfer arm mechanism arranged at the middle region of the transfer space, for transferring the substrates one by one to/from each of the circularly moving transfer arm mechanisms via the delivery table;

said vertically transfer arm mechanism comprising
a holder for holding the substrate;
an up-and-down moving mechanism for moving the holder up and down;
a $\theta$ rotary moving mechanism for rotating the holder about a vertical shaft; and
a back-and-forth moving mechanism for moving the holder back and forth, wherein said each of the circularly moving main transfer arm mechanisms comprises
a holder for holding the substrate;
a loop moving mechanism for moving the holder along the loop transfer path;
a $\theta$ rotary moving mechanism for rotating the holder about a vertical shaft; and
a back-and-forth moving mechanism for moving the holder back and forth.

12. The system according to claim 11, wherein the vertical transfer arm mechanism comprises:

first and second holders for holding the substrate;

a first up-and-down moving mechanism for moving the first holder up and down;

a second up-and-down moving mechanism for moving a second holder up and down;

a first $\theta$ rotation initiating mechanism for rotating the first holder about the vertical shaft;

a second $\theta$ rotation initiating mechanism for rotating the second holder about the vertical shaft;

a first back-and-forth moving mechanism for moving the first holder back and forth; and a second back-and-forth moving mechanism for moving the second holder back and forth.

13. The system according to claim 12, wherein the first and second holders, the first and second up-and-down moving mechanism, the first and second $\theta$ rotation initiating mechanism and the first and second back-and-forth moving mechanism are arranged in a lower region of the transfer space.

14. The system according to claim 12, wherein the first holder, the first up-and-down moving mechanism, the first $\theta$ rotation initiating mechanism, and first back-and-forth moving mechanism are arranged in a lower region of the transfer space; and the second holder, the second up-and-down moving mechanism, the second $\theta$ rotation initiating mechanism, and second back-and-forth moving mechanism are arranged in an upper region of the transfer space.

15. The system according to claim 11, wherein the process section comprises a first coating unit for applying an anti-reflection film liquid to the substrate, a second coating unit for applying a resist solution to the substrate;

a developing unit for developing a resist coating film on the substrate; and a thermal process unit for applying heat treatment to the substrate.

16. The system according to claim 15, wherein the thermal process unit is arranged above the first and second coating units and the developing unit.

* * * * *